(12) United States Patent
Ramaswamy et al.

(10) Patent No.: US 7,173,498 B2
(45) Date of Patent: Feb. 6, 2007

(54) REDUCING THE COUPLING BETWEEN LC-OSCILLATOR-BASED PHASE-LOCKED LOOPS IN FLIP-CHIP ASICS

(75) Inventors: Sridhar Ramaswamy, Plano, TX (US); Hassan O. Ali, Richardson, TX (US); Song Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 10/952,343

(22) Filed: Sep. 28, 2004

(65) Prior Publication Data

US 2006/0071714 A1   Apr. 6, 2006

(51) Int. Cl.
H03B 5/12 (2006.01)
H03B 1/04 (2006.01)
H03B 5/08 (2006.01)
H01L 29/41 (2006.01)

(52) U.S. Cl. .................. 331/108 C; 331/105; 331/167; 257/778; 257/784

(58) Field of Classification Search ............ 331/108 C, 331/105, 167; 257/778, 784
See application file for complete search history.

(56) References Cited

U.S. PATENT DOCUMENTS

| | | | |
|---|---|---|---|
| 6,462,423 B1 | 10/2002 | Akram et al. | |
| 6,627,999 B2 | 9/2003 | Akram et al. | |
| 6,703,714 B2 | 3/2004 | Akram et al. | |
| 6,777,774 B2* | 8/2004 | Beng et al. | 257/531 |
| 6,825,554 B2* | 11/2004 | Liew et al. | 257/698 |
| 6,841,886 B2* | 1/2005 | Nakata et al. | 257/778 |
| 2002/0041216 A1* | 4/2002 | Welland et al. | 331/117 R |
| 2002/0153166 A1* | 10/2002 | Chang | 174/260 |
| 2003/0127704 A1* | 7/2003 | Kobayashi et al. | 257/531 |
| 2005/0029632 A1* | 2/2005 | McKinzie et al. | 257/665 |

\* cited by examiner

*Primary Examiner*—Robert Pascal
*Assistant Examiner*—James Goodley
(74) *Attorney, Agent, or Firm*—Alan K. Stewart; W. James Brady; Frederick J. Telecky, Jr.

(57) ABSTRACT

Disclosed are integrated circuits having multiple electromagnetically emissive devices, such as LC oscillators. The devices are formed on an integrated circuit substrate and are given different planar orientations from each other. Particular integrated circuit packages disclosed are "flip-chip" packages, in which solder bumps are provided on the integrated circuit substrate for flipping and mounting of the finished integrated circuit upon a printed circuit board or other substrate. The solder bumps provide conductive connections between the integrated circuit and the substrate. The orientations and positioning of the emissive devices are such that one or more of the solder bumps are interposed between neighboring emissive devices to act as an electromagnetic shield between them.

20 Claims, 3 Drawing Sheets

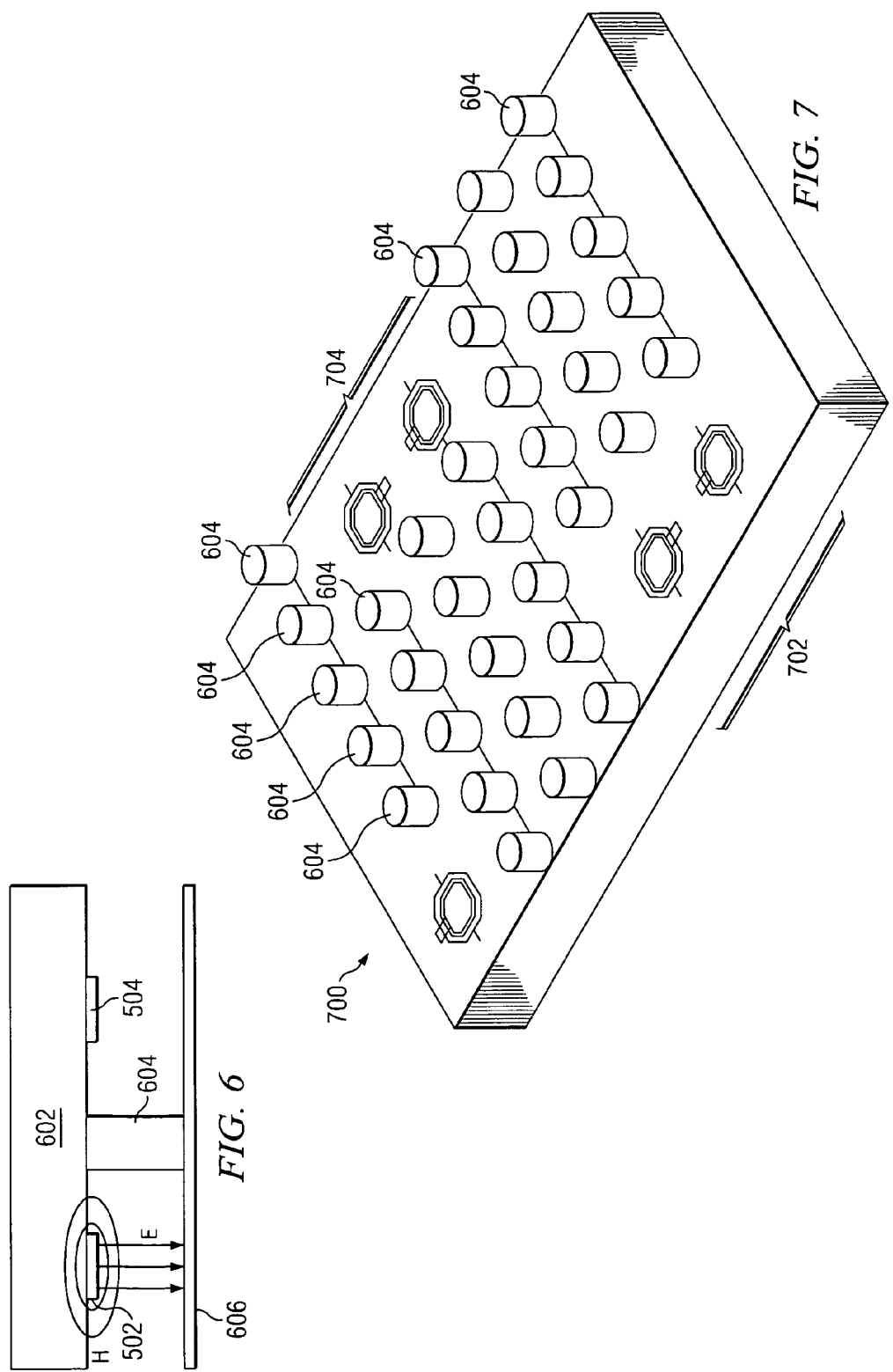

US 7,173,498 B2

REDUCING THE COUPLING BETWEEN LC-OSCILLATOR-BASED PHASE-LOCKED LOOPS IN FLIP-CHIP ASICS

TECHNICAL FIELD

The embodiments disclosed in this application relate to packaging strategies and layouts for flip-chip designs using multiple phase-locked loops with LC-oscillators.

BACKGROUND

Phase-locked loops are often designed using LC-oscillators, which have a certain fundamental frequency. The LC-oscillator is a resonant frequency circuit comprising an inductor, which is the origin of the "L" term, and a capacitor, which is the origin of the "C" term. In a quadrature phase-locked loop (PLL) circuit, two separate inductors are positioned close to each other, where the first inductor provides in-phase oscillation whereas the second inductor provides quadrature oscillation. Together, these two inductors and their corresponding capacitors provide 4 phases of a clock, CLK0, CLK90, CLK180, and CLK270, where CLK0 and CLK180 are the in-phase oscillation signals and CLK90 and CLK270 are the quadrature oscillation signals. The first and second inductors are positioned close enough to each other such that they are self-coupled.

These circuit elements are often placed on a single substrate with other circuit elements such that they can be integrated within a single chip. There may be multiple such phase-locked loop circuits or macros provided within a certain chip design. It is important for the phase-locked loop circuits to provide steady clock signals with minimum jitter.

SUMMARY

As multiple phase-locked loop circuits are placed in a similar integrated circuit device, problems can arise from adjacent inductors coupling not only to their paired inductors within a given phase-locked loop, but also in coupling to the inductors of adjacent phase-locked loop macro circuits. Since the strength of an inductive coupling is related to the distance between the coupled inductors, one way of reducing the coupling between the inductors of adjacent phase-locked loop macro circuits is to place more space in between those macros, but that would of course increase circuitry size, thereby limiting the number or PLLs that can be placed on a single chip and/or increasing the chip die size.

When phase-locked loop circuits are employed with flip-chip packaging technology, characteristics of the flip-chip packaging technology can be used to help mitigate the problem of cross-coupled inductor circuits from adjacent circuit macros. Specifically, the ground-bumps that are typically used in a flip-chip design can be used to provide field isolation between adjacent macros.

BRIEF DESCRIPTION OF THE DRAWINGS

For a more complete understanding of the principles disclosed herein and the advantages thereof, reference is now made to the following descriptions taken in conjunction with the accompanying drawings, in which:

FIG. 6 shows two inductors mounted on a silicon substrate above a VSSA package claim separated at least in part by a ground bump; and FIG. 7 is a layout diagram showing adjacent macros in which neighboring macros are flipped and have conductive bumps positioned such that the inductors between neighboring macros are well separated.

DETAILED DESCRIPTION

Figure 1:
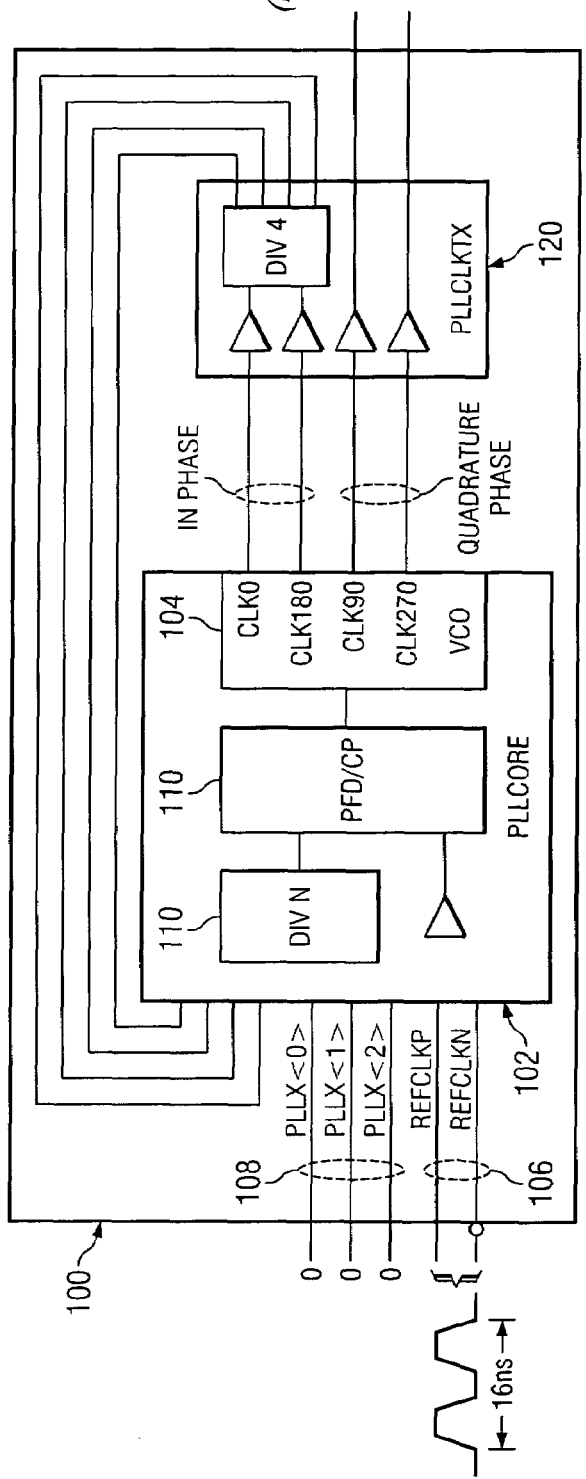
FIG. 1 is a schematic diagram of a phase-locked loop circuit.

FIG. 1 is a circuit diagram showing a phase-locked loop circuit 100. The phase-locked loop circuit 100 includes a PLL core 102, which is the circuit in which the Voltage Controlled Oscillator (VCO) circuit 104 is located. The PLL core 102 receives differential reference clock signals REFCLKN and REFCLKP 106 and it receives PLLX division signals 108 which determine the division factor to set the number of clock-multiples of the phase-locked loop circuit relative to the reference clock signal 106. Additional circuitry 110 is provided within the PLL core 102 in order to effect the division of the reference clock signals 106 whereby the VCO circuit 104 receives a properly divided clock signal upon which the VCO circuit 104 will lock.

Outputs of the VCO circuit 104 include the in-phased clock signals, CLK0 and CLK180, and the quadrature phase or out of phase clock signals, CLK90 and CLK270. A PLL clock transmission block 120 is provided for external generation of the PLL clock outputs, as well as providing output signals for feedback to the input to the PLL core circuit 104.

The PLL circuit 100 has an operation that is commonly understood in the art. The specific implementations and embodiments disclosed in this patent application and any patents that may issue from it can be used effectively in any application in which it is desirable to effect an electrical isolation between adjacent circuits and particularly inductive circuits where inductive coupling can occur.

Figure 2:
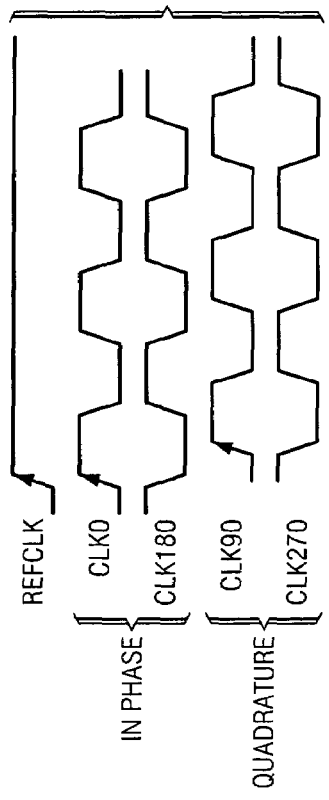
FIG. 2 is a timing diagram of the phase-locked loop clock signals in an intermediate portion of the circuitry of FIG. 1.
Figure 3:
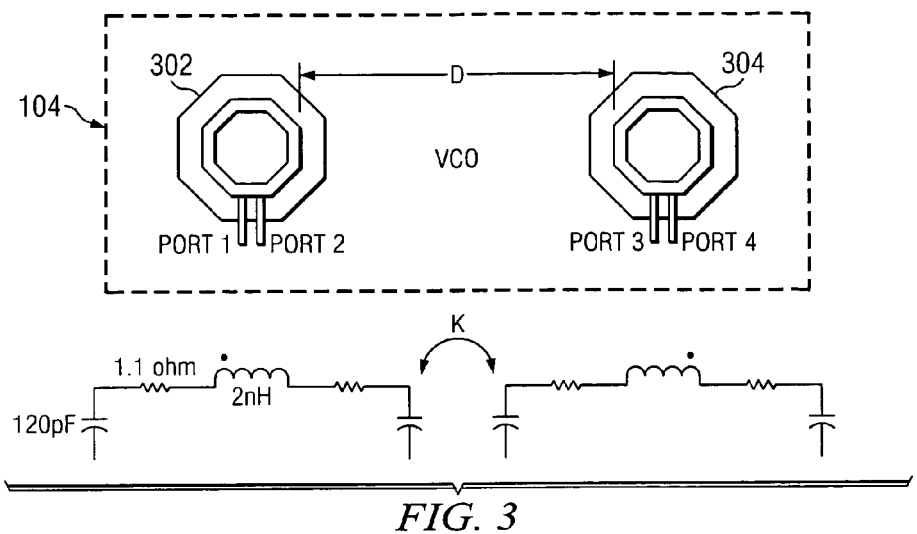
FIG. 3 is an exemplary layout of adjacent first and second inductors within an individual phase-locked loop circuit.

FIG. 2 shows an example of the clock signals that would be generated out of the PLL circuit 100 based on a given division factor and reference clock REFCLK signal. As shown in FIG. 3, there can be self-coupling between the inductive circuits that generate these clock signals, which in this case is indicated by the K showing the coupling between the two model LC circuits drawn beneath the adjacent inductors. In the case of the quadrature and in-phased phase-locked loop signals, the self-coupling is desirable in that it maintains the lock in-phase between the adjacent inductive circuits. For example, in the circuit shown in FIG. 3, the first inductor 302 and second inductor 304 are separated 100 micrometers by a distance D. Both of these inductors 302, 304 would be located within the VCO circuit 104 as shown in FIG. 1. Each of the inductive circuits can be modeled as a two-port device having a certain capacitance, resistance, and inductance. The self-conductance between them can be designed so as to maintain a magnetic coupling factor that is dependant on the amount of magnetic flux linking the two inductor coils.

Figure 4:
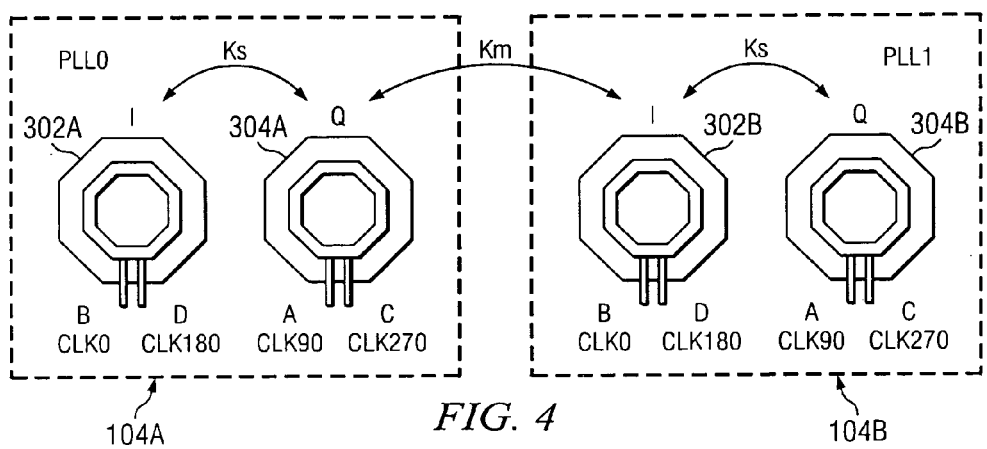
FIG. 4 is a layout diagram of adjacent inductors pairs on adjacent phase-locked loop circuit macros.

FIG. 4 shows adjacent portions of VCO circuits 104A, 104B in which the pairs of inductors are located. There is an inductive self-coupling Ks between the first set of inductors 302A and 304A and another inductive self-coupling between the second pair of inductors 302B and 304B. This is normal and expected. But there is also a parasitic cross-inductive coupling between the second inductor of the first circuit 304A and the first inductor 302B of the second circuit. This would happen in a situation where there are adjacent PLL circuits on adjacent macro circuits. The cross-coupling between these adjacent inductors causes clock jitter, such that instead of having a steady clock frequency, the clock frequency can be pulled off by inductive coupling to the neighboring circuit and by the corresponding oscillation occurring in that neighboring circuit's inductor.

Figure 5:
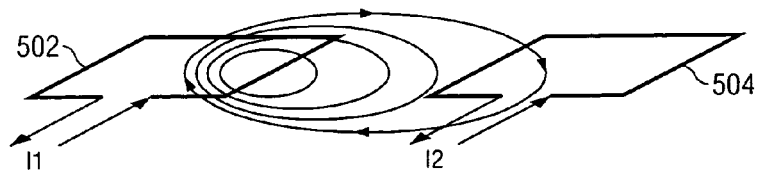
FIG. 5 is a conceptual diagram showing the inductive coupling that can occur between adjacent inductors in neighboring phase-locked loop circuit macros.

FIG. 5 conceptually illustrates the cross-coupling between a first inductor 502 and a second inductor 504. In the figure shown, a current is illustrated as flowing through the first inductor 502. The current flowing through the inductor 502 will cause lines of magnetic flux encircling the conductor of the inductor 502. Although these lines of flux become weaker and weaker as they become farther from the inductor 502, there will still be lines of flux. In the example shown here, the two inductors 502 and 504 are close enough such that lines of flux will cross over and through the inductor 504. Thus, current flowing through the inductor 502 can cause magnetic lines of flux to pass through the inductor 504, which will in turn cause inductive current to flow through the inductor 504. The same effect would happen with currents passing through the inductor 504 by cross-coupling over to inductor 502. Thus, if a certain resonance oscillation were occurring at a certain frequency in inductor 502 in conjunction with an LC circuit, current flowing in other inductors, such as inductor 504, could cause essentially any currents in the inductor 502, and this cross-coupling would cause frequency jitter to occur in the oscillation of the LC circuit of the first inductor 502. Again, as mentioned, the same effect would happen for the oscillations that would occur with the second inductors associated LC resonant circuit. So what is desired is to separate these two inductors to electrically isolate them. This can be done by placing them farther apart, but this would drive up the die size of an integrated circuit upon which these inductors will be placed. Alternatively, they might be electrically isolated by shielding techniques. What is suggested in the current application is to use the characteristics of a flip-chip technology integrated circuit to electrically isolate the neighboring inductors from different circuit macros.

FIG. 6 shows an example of how this electrical isolation can be carried out in a flip-chip technology approach. FIG. 6 shows a silicon substrate 602 upon which first and second inductors 502 and 504 are formed. The first and second inductors 502 and 504 constitute embodiments of electromagnetically emissive semiconductor devices. In some embodiments, the first and second inductors 502 and 504 can be spiral inductors of any shape. In some embodiments, the first and second inductors 502 and 504 comprise wound conductors that are the inductive elements of respective LC oscillators, which can constitute embodiments of electromagnetically emissive semiconductor devices. Between these neighboring inductors 502 and 504 is a bump 604 that is used to separate the substrate 602 with circuitry on it from a VSSA package plane 606 (e.g., analog ground plane). The bump 604 is a conductive element, for example a solder bump, that connects the ground circuits of the circuitry of the substrate 602 to the VSSA package plane 606. Multiple bumps can serve to form a radiative shield that will at least partially block the lines of flux that would otherwise connect the neighboring inductors 502 and 504.

FIG. 7 provides a perspective view of circuit 700 having neighboring PLL circuit macros 702, 704. The bump 604 provides the shielding effect that was discussed with respect to the cross-sectional view of FIG. 6. Further, in this embodiment the first macro 702 has a first orientation (e.g., planar orientation) as illustrated in the figure, whereas the second macro 704 has an orientation that is flipped, or opposed 180° from, the orientation of the first circuit macro 702. In this way, a greater volume or cross-sectional area of bumps 604 are provided between the inductors of the neighboring circuit macros 702 and 704.

Integrated circuit devices incorporating the principles disclosed herein can be fabricated according to known fabrication techniques, such as those relating to flip-chip forms, and techniques other than flip-chip semiconductor architectures and fabrication techniques. The principles disclosed herein may also be adapted for use with any size or shaped semiconductor package and alternative configurations of bond pads or conductive elements. The flip-chip semiconductor devices may be fabricated on the surface of the silicon substrate 602, or alternately on the surface of a semiconductor wafer of gallium arsenide or indium phosphide.

Although the embodiments shown here are described with respect to neighboring PLL circuits on integrated circuit device, the flip-chip technology and its conductive ground bumps can be used for isolation of adjacent circuits and the opposed orientations of those circuits can be used in any context in which it is desirable to maximize the electrical isolation between adjacent circuits.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. An integrated circuit comprising a plurality of semiconductor devices on an integrated circuit substrate, the integrated circuit comprising:
   a first circuit macro having a first pair of inductors formed on the integrated substrate;

a second circuit macro having a second pair of inductors formed on the substrate; and a plurality of conductors for connecting ground circuits of the integrated circuit to a ground plane, the conductors having at least a certain height greater than at least the first and second pair of inductors and adjacent to and at least partially interposed between the first and second pair of inductors, whereby the at least partially interposed plurality of conductors at least partially electromagnetically shields the first and second pair of inductors from each other.

2. A circuit according to claim 1, wherein the first and second pairs of inductors comprise LC oscillators.

3. A circuit according to claim 1, wherein the first and second pairs of inductors are wound conductors that are the inductive elements of LC oscillators.

4. A circuit according to claim 1, wherein the first and second pairs of inductors comprise oscillators for phase-locked loop circuits.

5. A circuit according to claim 1, wherein the plurality of conductors are solder bumps.

6. A circuit according to claim 1, wherein the integrated circuit is a flip-chip integrated circuit and wherein the plurality of conductors are solder bumps that are used to mount the flip-chip integrated circuit to a printed circuit board or other circuit substrate.

7. A circuit according to claim 1, wherein one inductor of both the first and second pairs of inductors has a planar orientation that is a 180-degree rotation from the other inductor of both the first and second pairs of inductors.

8. A circuit according to claim 1, wherein at least two of the plurality of conductors are interposed between the first and second pairs of inductors and at least partially electromagnetically shield the first and second pairs of inductors from each other.

9. A method of fabricating an integrated circuit comprising:

forming a first circuit macro having a first pair of inductors formed on the integrated substrate;

forming a second circuit macro having a second pair of inductors formed on the substrate; and forming a plurality of conductive elements for connecting ground circuits of the integrated circuit to a ground plane, the conductive elements having at least a certain height greater than at least the first and second pair of inductors and adjacent to and at least partially interposed between the first and second pair of inductors, whereby the at least partially interposed plurality of conductors at least partially electromagnetically shields the first and second pair of inductors from each other.

10. A method according to claim 9, wherein the forming of the conductors, the forming of the first pair of inductors and the forming of the second pairs of inductors are carried out in any order.

11. A method according to claim 9, wherein the forming of the first pair of inductors and the forming of the second pairs of inductors include forming LC oscillators.

12. A method according to claim 9, wherein the forming of the first pair of inductors and the forming of the second pairs of inductors include forming wound conductors for serving of the inductive elements of LC oscillators.

13. A method according to claim 9, wherein the forming of the first pair of inductors and the forming of the second pairs of inductors include forming oscillators for phase-locked loop circuits.

14. A method according to claim 9, wherein the forming of the plurality of conductors includes forming solder bumps.

15. A method according to claim 9, wherein the integrated circuit is a flip-chip integrated circuit, and wherein the forming of the plurality of conductors includes forming solder bumps for mounting the flip-chip integrated circuit to a printed circuit board or other circuit substrate.

16. A method according to claim 9, wherein one inductor of both the first and second pairs of inductors has a planar orientation that is a 180-degree rotation from the other inductor of both the first and second pairs of inductors.

17. A method according to claim 9, wherein the forming of the plurality of conductors includes forming at least two of the plurality of conductors interposed between the first and second pairs of inductors for at least partially electromagnetically shielding the first and second pairs of inductors from each other.

18. An integrated circuit comprising a plurality of semiconductor devices on an integrated circuit substrate, the integrated circuit comprising:

a first phase locked loop circuit macro having a first pair of inductors formed on the integrated substrate;

a second phase locked loop circuit macro having a second pair of inductors formed on the substrate; and a plurality of conductive elements for connecting ground circuits of the integrated circuit to a ground plane, the conductive elements having at least a certain height greater than at least the first and second pair of inductors and adjacent to and at least partially interposed between the first and second pair of inductors, whereby the at least partially interposed plurality of conductors at least partially electromagnetically shields the first and second pair of inductors from each other.

19. A circuit according to claim 18, further comprising a third phase locked loop circuit macro having a third pair of inductors formed on the substrate, wherein the third phase locked loop circuit interposes the first and second phase locked loop circuit macros.

20. A circuit according to claim 19, wherein said plurality of conductive elements at least partially interposing between the first and second pair of inductors are for connecting ground circuits of the third phase locked loop circuit macro to a ground plane.

* * * * *